United States Patent
Hagihara et al.

(10) Patent No.: US 6,780,342 B1
(45) Date of Patent: Aug. 24, 2004

(54) METHOD OF ETCHING AND METHOD OF PLASMA TREATMENT

(75) Inventors: Masaaki Hagihara, Beverly, MA (US); Koichiro Inazawa, Yamanashi (JP); Wakako Naito, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/030,656

(22) PCT Filed: Aug. 23, 2000

(86) PCT No.: PCT/JP00/05624

§ 371 (c)(1),
(2), (4) Date: Jan. 11, 2002

(87) PCT Pub. No.: WO01/17007

PCT Pub. Date: Mar. 8, 2001

(30) Foreign Application Priority Data

Aug. 27, 1999 (JP) .......................................... 11-241427

(51) Int. Cl.[7] .............................................. H01L 21/00
(52) U.S. Cl. .............................. 216/67; 216/72; 216/78; 216/79; 438/710; 438/714; 438/724; 438/725; 438/744
(58) Field of Search .............................. 216/47, 49, 51, 216/67, 72, 78, 79; 438/710, 717, 724, 725, 744

(56) References Cited

U.S. PATENT DOCUMENTS

| | | | |
|---|---|---|---|
| 6,093,632 A | * | 7/2000 | Lin .............................. 438/618 |
| 6,107,208 A | | 8/2000 | Cheng et al. ................ 438/724 |
| 6,162,583 A | * | 12/2000 | Yang et al. .................. 430/313 |
| 6,204,192 B1 | * | 3/2001 | Zhao et al. .................. 438/723 |
| 6,380,096 B2 | * | 4/2002 | Hung et al. .................. 438/723 |

FOREIGN PATENT DOCUMENTS

| | | |
|---|---|---|
| EP | 0 993 031 A2 | 4/2000 |
| EP | 0 993 031 A3 | 5/2000 |
| EP | 1 041 614 A1 | 10/2000 |
| GB | 2326765 | 12/1998 |
| GB | 2 333 268 | 7/1999 |
| JP | 5-160077 | 6/1993 |
| JP | 6-204191 | 7/1994 |

OTHER PUBLICATIONS

Ueno, K., et al., "Low Resistance Copper Via Technology," Advanced Interconnects and Contacts, San Francisco, CA, Apr. 5–7, 1999, Materials Research Society Symposium Proceedings, vol. 564, pp. 521–533.

Wong, T.K.S., et al., "Fabrication of Sub–20 nm Trenches in Silicon Nitride Using $CHF_3/O_2$ Reactive Ion Etching and Oblique Metallization," Journal of Vacuum Science and Technology: Part B, American Institute of Physics, New York, NY, vol. 10, No. 6, pp2393–2397.

* cited by examiner

*Primary Examiner*—Allan Olsen
(74) *Attorney, Agent, or Firm*—Finnegan, Henderson, Farabow, Garrett & Dunner, LLP (57) ABSTRACT

A processing gas constituted of $CH_2F_2$, $O_2$ and Ar is introduced into a processing chamber 102 of a plasma processing apparatus 100. The flow rate ratio of the constituents of the processing gas is set at $CH_2F_2/O_2/Ar=20$ sccm/10 sccm/100 sccm. The pressure inside the processing chamber 102 is set at 50 mTorr. 500 W high frequency power with its frequency set at 13.56 Mz is applied to a lower electrode 108 on which a wafer W is placed. The processing gas is raised to plasma and thus, an $SiN_x$ layer 206 formed on a Cu layer 204 is etched. The exposed Cu layer 204 is hardly oxidized and C and F are not injected into it.

35 Claims, 4 Drawing Sheets

METHOD OF ETCHING AND METHOD OF PLASMA TREATMENT

TECHNICAL FIELD

The present invention relates to an etching method and a plasma processing method.

BACKGROUND ART

As ultra high integration in semiconductor devices increasing in recent years, manufacturing superfine metal wirings that conform to rigorous design rules has become a crucial technical requirement. However, when the aluminum wirings normally utilized in the prior art, such as wirings constituted of Al or an Al alloy, are miniaturized, the level of the electrical resistance becomes significant, which readily causes a wiring delay, lowering the operating speed of the semiconductor device. As a solution, adoption of Cu having a lower electrical resistance value than Al as the wiring material has been considered in recent years. However, Cu becomes oxidized more readily than Al. Accordingly, during the semiconductor manufacturing process, a Cu wiring layer is covered with a layer constituted of a material that does not contain $O_2$, e.g., an $SiN_x$ layer, to prevent oxidation of the Cu wiring layer by assuring that it is not exposed to $O_2$.

When connecting a Cu wiring to another wiring in a semiconductor device adopting a multilayer wiring structure, it is necessary to etch the $SiN_x$ layer and to form at the $SiN_x$ layer a connecting hole such as a via hole through which the Cu wiring layer is exposed. However, a CF (fluorocarbon) processing gas containing $O_2$ is usually utilized in the plasma etching process during which the $SiN_x$ layer is etched. As a result, the surface of the exposed Cu wiring layer becomes oxidized by $O_2$ or an oxide compound is formed at the Cu wiring layer during the etching process. Such a reaction product raises the electrical resistance value at the area where the Cu wiring is connected with the other wiring, thereby presenting a problem in that the device characteristics of the semiconductor device are compromised.

An object of the present invention, which has been completed by addressing the problem of the prior art discussed above, is to provide a new and improved etching method and a new and improved plasma processing method that solve the problem above and other problems.

DISCLOSURE OF THE INVENTION

In order to achieve the object described above, in a first aspect of the present invention, an etching method for etching an $SiN_x$ layer present on a Cu layer formed at a work piece placed in a processing chamber by raising to plasma a processing gas introduced into the processing chamber, which is characterized in that the processing gas contains a gas constituted of C, H and F and $O_2$, is provided.

In the etching process implemented by using the gas constituted of C, H and F according to the present invention, the exposed surface of the Cu layer is not oxidized readily. In addition, this effect is sustained regardless of whether or not $O_2$ is present. For this reason, even when a, wiring, for instance, is connected at the exposed surface of the Cu layer, the electrical resistance value at the connection area is not raised. Furthermore, by adding $O_2$ into the gas constituted of C, H and F, it becomes possible to even more effectively prevent the oxidation of the Cu layer.

The gas constituted of C, H and F should be $CH_2F_2$, $CH_3F$ or $CHF_3$.

In addition, it is desirable to add an inert gas into the processing gas. When an inert gas is added into the processing gas, the contents of the gas constituted of C, H and F and $O_2$ can be adjusted as necessary in correspondence to specific process requirements while maintaining the quantity of the processing gas introduced into the processing chamber at a predetermined level.

Moreover, in a second aspect of the present invention, a plasma processing method comprising a step in which an $SiN_x$ layer is etched by using a photoresist layer having a specific pattern formed therein, a step implemented after the etching step, a step implemented after said etching step, in which said photoresist layer is ashed and a step implemented after said ashing step, in which a plasma process is implemented on the exposed Cu layer by raising to plasma $H_2$ introduced into the processing chamber is provided.

It is to be noted that the exposed surface of the Cu layer may become oxidized during the ashing step as well. In addition, if a CF gas is used as the processing gas during the etching step, C (carbon atoms) and F (fluorine atoms) may be injected into the exposed surface of the Cu layer. Accordingly, in a third aspect of the present invention, the surface of the Cu layer is treated with $H_2$ plasma after the etching step and the ashing step to deoxidize the oxidized Cu and to remove C and F. As a result, the electrical resistance value at the connection area where the Cu wiring is connected to the other wiring is prevented from increasing even more effectively.

BEST MODE FOR CARRYING OUT THE INVENTION

The following is a detailed explanation of a preferred embodiment of the etching method and the plasma processing method according to the present invention, given in reference to the attached drawings.

(1) Etching Method

First, the etching method adopted in the embodiment is explained.

(a) Overall Structure of Etching Apparatus

Figure 1:
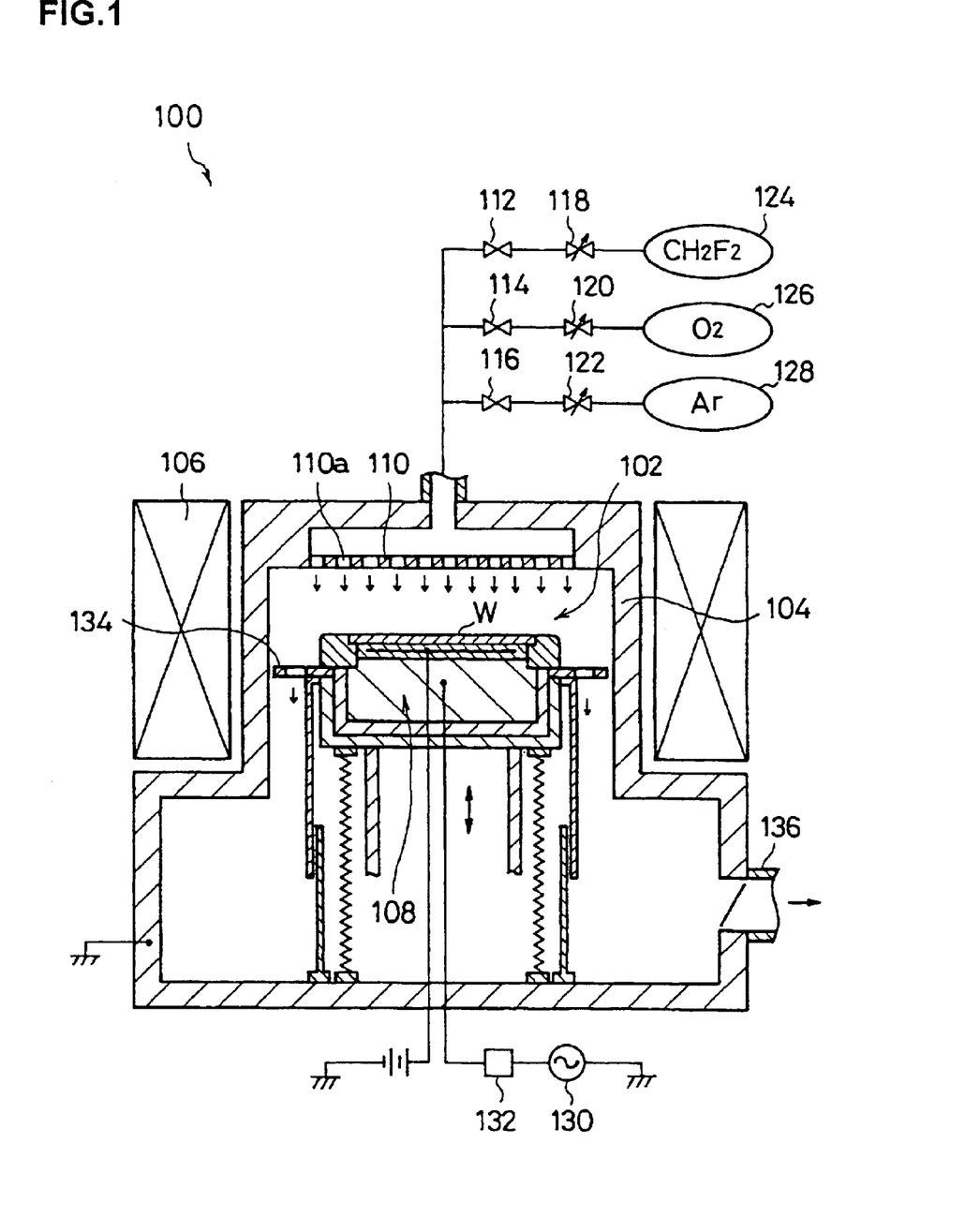
FIG. 1 is a schematic sectional view of a plasma processing apparatus in which the present invention may be adopted.

First, in reference to FIG. 1, a brief explanation is given on a plasma processing apparatus 100 that may adopt the etching method achieved in the embodiment. A processing chamber 102 is formed in an airtight processing container 104. A magnet 106 is provided around the processing container 104 so as to form a rotating magnetic field inside the processing chamber 102. In addition, a lower electrode 108 on which a workpiece such as a semiconductor wafer (hereafter referred to as a "wafer") W may be placed is provided inside the processing chamber 102. An upper electrode 110 is provided to face opposite the mounting surface of a lower electrode 108 in the processing chamber 102.

Numerous gas outlet holes 110a are formed at the upper electrode 110. The gas outlet holes 110a are connected with first~third gas supply sources 124, 126 and 128 respectively via first~third switching valves 112, 114 and 116 and first~third flow regulating valves 118, 120 and 122. $CH_2F_2$, $O_2$ and Ar constituting the processing gas used in the embodiment are respectively stored in the first~third gas supply sources 124, 126 and 128. This structure allows the processing gas constituted of $CH_2F_2$, $O_2$ and Ar individually set at predetermined flow rates to be introduced into the processing chamber 102 via the gas outlet holes 110a. It is to be noted that the etching process implemented by using the processing gas is to be detailed later.

In addition, the processing gas introduced into the processing chamber 102 is raised to plasma when high frequency power output from a high frequency source 130 is applied to the lower electrode 108 via a matcher 132. The gas inside the processing chamber 102 is evacuated via a baffle plate 134 provided around the lower electrode 108 and an evacuating pipe 136. It is to be noted that the plasma processing apparatus 100 assumes a structure which allows it to perform an ashing process and a surface treatment on a Cu layer 204 to be detailed later as well as the etching process.

(b) Etching Process

Figure 2A:
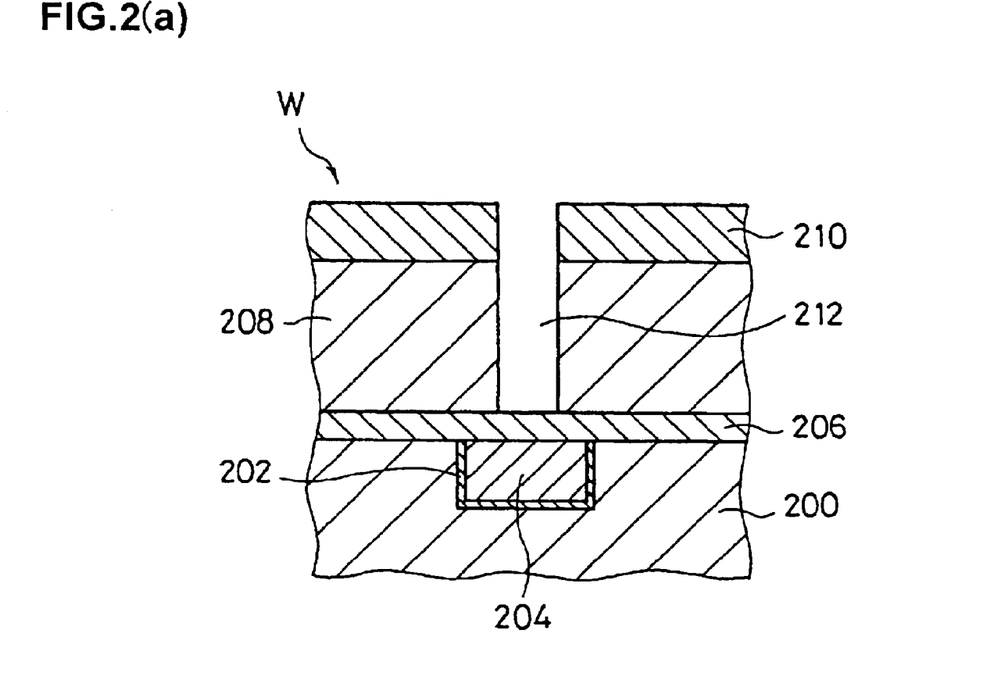
FIG. 2 presents schematic sectional views of a wafer before and after implementing a process by adopting the etching method according to the present invention.
Figure 2B:
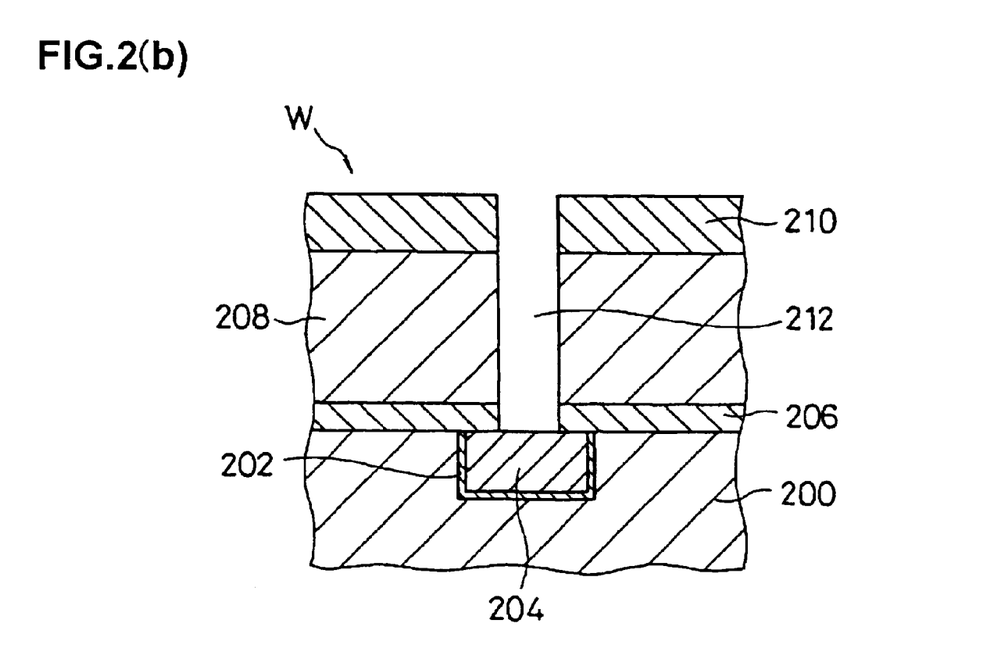

Next, in reference to FIGS. 1 and 2, a detailed explanation is given on the etching process implemented on the wafer W by using the processing gas in the embodiment. It is to be noted that FIG. 2(a) presents a schematic sectional view of the wafer W in the state before an $SiN_x$ layer 206 is etched. FIG. 2(b) presents a schematic sectional view of the wafer W in the state after the $SiN_x$ layer 206 is etched.

As shown in FIG. 2(a), the Cu layer (Cu wiring layer) 204 is formed at a first $SiO_2$ layer 200 via a TaN layer 202 which functions as a barrier metal layer. In addition, the $SiN_x$ layer 206 which is to undergo the etching process in the embodiment is formed on the Cu layer 204 to prevent the oxidization of the Cu layer 204. A second $SiO_2$ layer 208 to be used as a layer insulating film and a photoresist layer 210 having a specific pattern formed therein are sequentially laminated over the $SiN_x$ layer 206.

The etching process is implemented in the embodiment after forming a via hole 212 which reaches the $SiN_x$ layer 206 is formed at the second $SiO_2$ layer 208 through a specific type of etching process as shown in FIG. 2(a). Namely, the processing gas introduced into the processing chamber 102 to etch the second $SiO_2$ layer 208 is first switched to the processing gas constituted of $CH_2F_2$, $O_2$ and Ar which characterizes the embodiment. At this point, the flow rate ratio ($CH_2F_2/O_2/Ar$) of $CH_2F_2$, $O_2$ and Ar is set at, for instance, 10 sccm~30 sccm/10 sccm~30 sccm/100 sccm~200 sccm. The pressure inside the processing chamber 102 may be set at, for instance, 30 mTorr~100 mTorr. Then, high frequency power having a frequency of, for instance, 13.56 MHz and achieving a 300 W~1000 W level is applied to the lower electrode 108.

Such high frequency power application causes the processing gas to dissociate to generate plasma. As a result, the $SiN_x$ layer 206 becomes etched by the plasma and the upper surface of the Cu layer 204 becomes exposed at the bottom of the via hole 212 as shown in FIG. 2(b). Since the $SiN_x$ layer 206 has been etched by using the processing gas constituted of $CH_2F_2$, $O_2$ and Ar, the surface of the Cu layer 204 is hardly oxidized during this process, as explained later in reference to subsequent implementation examples.

(c) Implementation Example

Figure 3A:
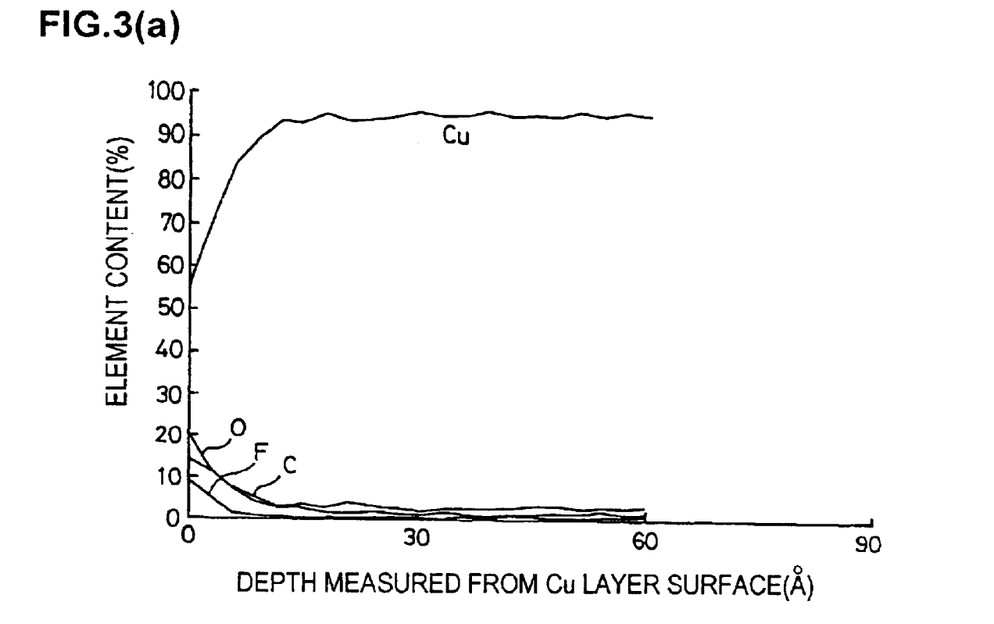
FIG. 3 presents schematic diagrams to facilitate an explanation of an implementation example of the etching method according to the present invention.
Figure 3B:
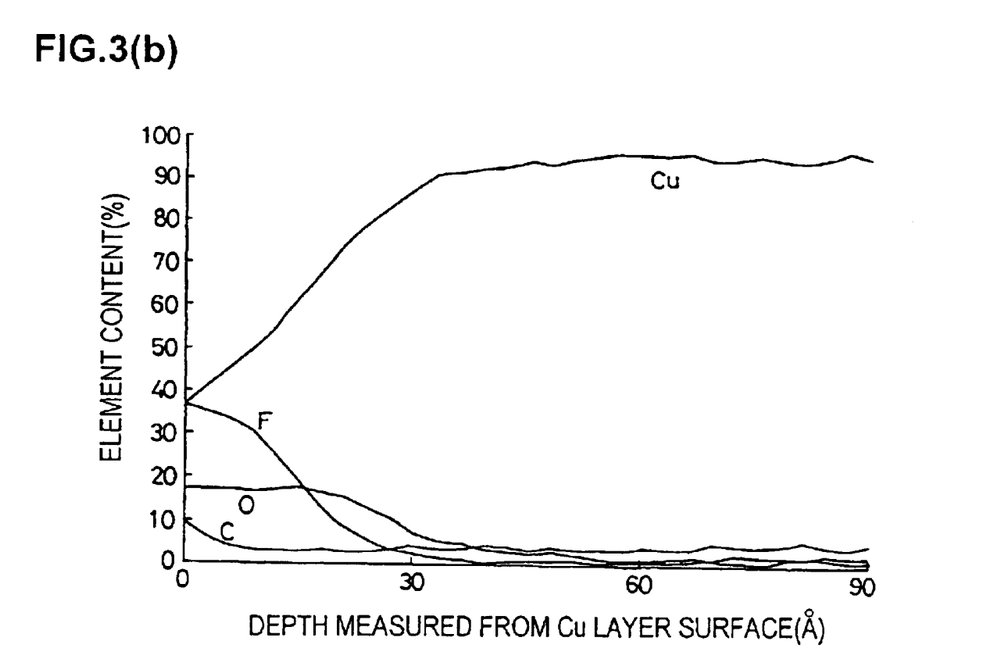
Figure 4A:
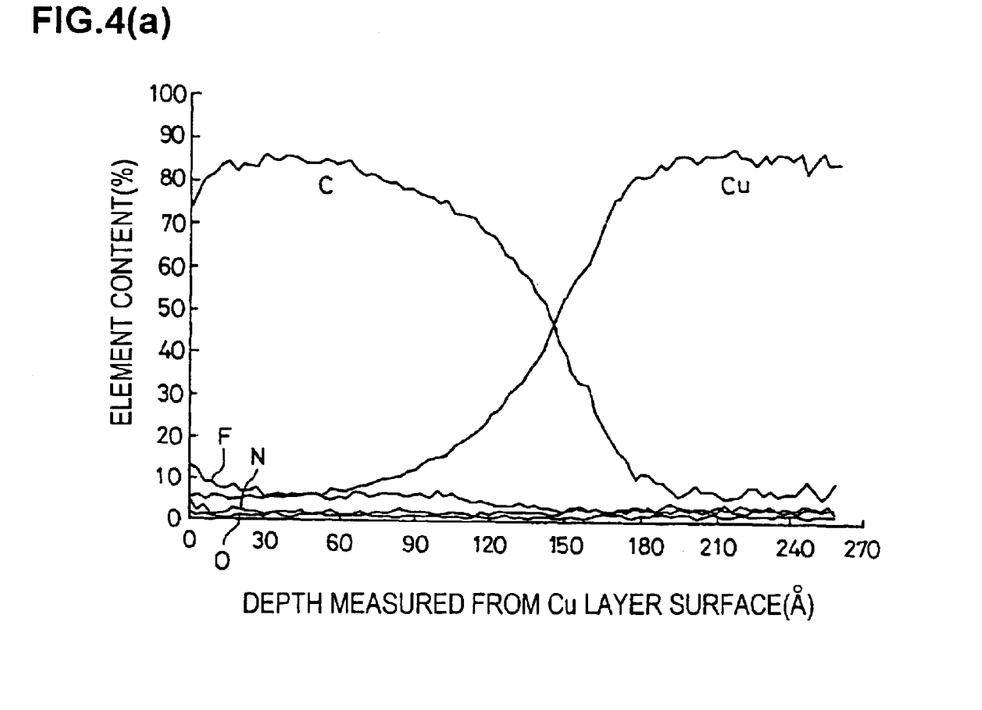
FIG. 4 presents schematic diagrams to facilitate an explanation of the implementation example of the etching method according to the present invention.
Figure 4B:
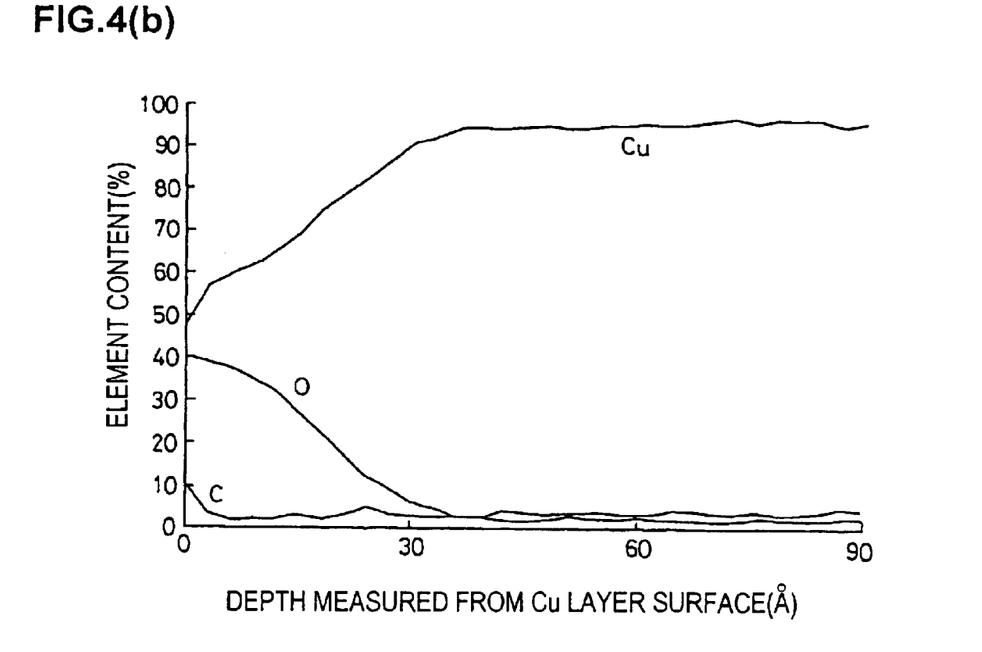

Next, an example of actual implementation of the embodiment is explained in reference to FIG. 3 and FIG. 4. It is to be noted that FIGS. 3(a) and (b) and FIGS. 4(a) and (b) each schematically illustrate the relationship between the depth measured from the surface of the Cu layer 204 and the content of the elements present in the Cu layer 204 at the corresponding depth. The Cu layer 204 was gradually etched by spraying Ar at a predetermined pressure on to the exposed surface of the Cu layer 204.

In the implementation example, the $SiN_x$ layer 206 at the wafer W shown in the FIG. 2(a) was etched by employing the plasma processing apparatus 100 explained earlier. The flow rate ratio of the constituents in the processing gas was set at $CH_2F_2/O_2/Ar$=20 sccm/10 sccm/100 sccm. In addition, the pressure inside the processing chamber 102 was set at 50 mTorr. High frequency power with a frequency set at 13.56 MHz and achieving a 500 W level was applied to the lower electrode 108. The results presented in FIG. 3(a) were achieved by etching the wafer under the conditions described above. As shown in FIG. 3(a), the Cu layer 204 was hardly oxidized when the process was implemented by using the processing gas constituted of $CH_2F_2$, $O_2$ and Ar, with hardly any C and F injection observed. Thus, we may conclude that the processing gas is effective in preventing damage to the Cu layer 204.

Next, as an example that provides a comparison to the implementation example described above, an etching process was implemented by using a processing gas constituted of $CF_4$ and Ar, and the results presented in FIG. 3(b) were obtained. It is to be noted that the processing gas constituted of $CF_4$ and Ar is normally used in an etching process implemented on the $SiO_2$ layer 208 or the $SiN_x$ layer 206. The flow rate ratio of the constituents of the processing gas was set at $CF_4/Ar$=20 sccm/100 sccm. Otherwise, the process was implemented under the same processing conditions as those described above. As shown in FIG. 3(b), when the processing gas constituted of $CF_4$ and Ar was used, the Cu layer 204 became oxidized to a greater depth and a greater degree of injection of C and F was observed compared to the extent of oxidation and C/F injection observed in the etching process implemented by using the processing gas constituted of $CH_2F_2$, $O_2$ and Ar described earlier. Thus, one may conclude that the Cu layer 204 becomes damaged more readily when the processing gas constituted of $CF_4$ and Ar is used.

In addition, an etching process was implemented by using a processing gas constituted of $CH_2F_2$, $N_2$ and Ar achieved by mixing $N_2$ instead of $O_2$, in order to ascertain the extent of the influence of $O_2$ present in the processing gas, and the results presented in FIG. 4(a) were achieved. It is to be noted that the flow rate ratio of the constituents of the processing gas was set at $CH_2F_2/N_2/Ar$ 20 sccm/10 sccm/100 sccm as in the processing gas constituted of $CH_2F_2$, $O_2$ and Ar. The process was implemented by setting the other processing conditions identically to those described earlier. As shown in FIG. 4(a), the Cu layer 204 became oxidized to an even further depth and a greater degree of C/F injection was observed when the processing gas constituted of $CH_2F_2$, $N_2$ and Ar was used compared to the extent of the oxidation and the C/F injection observed in the process implemented by using the processing gas constituted of $CH_2F_2$, $O_2$ and Ar and the process implemented by using the processing gas constituted of $CF_4$ and Ar. This demonstrates that the presence Of $O_2$ in the processing gas constituted of $CH_2F_2$, $O_2$ and Ar does not adversely affect the Cu layer 204 but rather, it effectively protects the Cu layer 204.

It is to be noted that the results presented in FIG. 4(b) were achieved by performing a similar measurement on the Cu layer 204 exposed to the atmosphere without implementing the etching process.

As described above, by etching the $SiN_x$ layer 206 covering the Cu layer 204 with the plasma generated from the processing gas constituted of $CH_2F_2$, $O_2$ and Ar, it is possible to minimize the extent of oxidation of the exposed Cu layer 204 and to reduce the extent to which C and F constituting the $CH_2F_2$ are injected into the Cu layer 204. As a result, the electrical resistance value at the connection area does not increase even when another wiring is connected to the exposed surface of the Cu layer 204.

(2) Ashing Method

Next, a method that may be adopted to implement an ashing process on the photoresist layer 210 formed at the wafer W is explained. During the process for manufacturing a semiconductor device, an ashing process is normally implemented after the etching process to remove the photoresist layer 210 used as an etching mask. However, there is a risk of the Cu layer 204 which has not been oxidized during the etching process becoming oxidized during the ashing process implemented by adopting the method in the prior art. Accordingly, it is desirable to implement an ashing process through the following method on the wafer W that includes the Cu layer 204.

Namely, following the etching process described above, the temperature of the wafer W remaining on the lower electrode 108 is sustained at 100° C. or lower and preferably at 40° C. The temperature of the wafer W is adjusted by a temperature control mechanism (not shown) internally provided at the lower electrode 108. In addition, a processing gas constituted of, for instance, $O_2$, is introduced into the processing chamber 102 at a flow rate of 200 sccm. Then, high frequency power with a frequency of 13.56 MHz and achieving a level of 1000 W is applied to the lower electrode 108. Through this power application, the processing gas is raised to plasma and thus, the photoresist layer 210 at the wafer W shown in FIG. 2(b) is removed.

In this method, the ashing process is implemented while sustaining the temperature of the wafer W at 100° C. or lower and, as a result, the degree to which the Cu layer 204 is oxidized is minimized. Thus, the state of the Cu layer 204 after the ashing process remains essentially unchanged from the state following the etching process.

(3) Method of Treating Surface of Cu Layer ($H_2$ Plasma Process)

Next, a method that may be adopted to treat the surface of the Cu layer 204 is explained. It is difficult to completely prevent the oxidation of the Cu layer 204 and the entry of C and F even when the process is implemented by adopting the etching method and the ashing method described above. Accordingly, it is desirable to implement the following surface treatment on the Cu layer 204.

Namely, after the etching process and the ashing process described above, the processing gas introduced into the processing chamber 102 is switched to $H_2$ with the wafer W still remaining inside the processing chamber 102. The flow rate of $H_2$ may be set at, for instance, 200 sccm. In addition, the pressure inside the processing chamber 102 may be set at, for instance, 50 mTorr. Then, $H_2$ plasma is generated inside the processing chamber 102 by applying 1000 W high frequency power with its frequency set at, for instance, 13.56 MHz to the lower electrode 108. The $H_2$ plasma thus generated deoxidizes the Cu layer 204 which has been oxidized. At the same time, the Cu layer 204 is subject to ion implant, which eliminates C and F having been injected into the Cu layer 204 during the etching process. As a result, a Cu layer 204 which does not contain O (oxygen atoms), C and F can be formed.

In addition, the relationship between the depth measured from the surface of the Cu layer 204 and the contents of O, C and F contained in the Cu layer 204 at the corresponding depth was ascertained with regard to the Cu layer 204 before and after the $H_2$ plasma process. The results indicate that the contents of O, C and F up to 30 Å from the surface of the Cu layer 204 became greatly reduced after the process.

Furthermore, the surface of the Cu layer 204 can be treated by utilizing the plasma processing apparatus 100 employed to implement the etching process and the ashing process when the method described above is adopted. This means that the surface of the Cu layer 204 does not need to be treated by employing another processing apparatus. Thus, the individual processes can be continuously performed on the plasma processing apparatus 100 to achieve an improvement in the throughput and a reduction in the production costs.

While the invention has been particularly shown and described with respect to the preferred embodiment thereof by referring to the attached drawings, the present invention is not limited to these examples and it will be understood by those skilled in the art that various changes in form and detail may be made therein without departing from the spirit, scope and teaching of the invention.

For instance, while an explanation is given above in reference to the embodiment on an example in which $CH_2F_2$ is used as a constituent of the etching processing gas, the present invention is not limited to this example and the advantages described above may be achieved by using $CH_2F_2$, $CH_3F$ or $CHF_3$ instead of $CH_2F_2$.

In addition, while an explanation is given above in reference to the embodiment on an example in which Ar is added into the etching processing gas, the present invention is not limited to this example and it may be effectively implemented by using an inert gas such as He instead of Ar or without adding any inert gas.

While an explanation is given above in reference to the embodiment on an example in which a single plasma processing apparatus is utilized to implement the etching process, the ashing process and the Cu layer surface treatment, the present invention is not limited to this example and it may be also adopted when separate plasma processing apparatuses are employed to perform the individual processes described above.

According to the present invention, the $SiN_x$ layer formed on the Cu layer can be etched, while minimizing the extent to which other elements become mixed in the Cu layer. In addition, other elements present in the Cu layer can be eliminated through the plasma process implemented by using $H_2$. As a result any degradation of the Cu layer can be prevented.

Industrial Applicability

As explained above, the present invention may be adopted during the process of manufacturing semiconductor devices and, in particular, it is ideal in an application in which a plasma process such as etching is implemented on an $SiN_x$ layer formed on a Cu layer.

What is claimed is:

1. An etching method for exposing a layer of Cu by etching a layer of $SiN_x$ on the layer of Cu with an etching gas constituted of C, H, and F, and $O_2$, the $O_2$ suppressing oxidation of the layer of Cu while the etching of the layer of $SiN_x$ occurs, wherein;

said gas constituted of C, H, and F is $CHF_3$.

2. An etching method for exposing a layer of Cu by etching a layer of $SiN_x$ on the layer of Cu, the method, wherein;

a step in which a processing gas containing a gas constituted of C, H, and F, and $O_2$ is raised to plasma and an $SiN_x$ layer on a Cu layer is etched using a photoresist layer having a specific pattern formed therein, thereby exposing said Cu layer the $O_2$ suppressing oxidation of an exposed portion of the Cu layer while the $SiN_x$ layer is etched; and a step in which $H_2$ is introduced into said processing chamber and an $H_2$ plasma process is implemented on said Cu layer that has become exposed by raising the $H_2$ to plasma while removing C atoms and F atoms introduced into the Cu layer that has been exposed during etching.

3. An etching method according to claim 2, wherein; said gas constituted of C, H and F is $CH_2F_2$.

4. An etching method according to claim 2, wherein; said gas constituted of C, H and F is $CH_3F$.

5. An etching method according to claim 2, wherein; said gas constituted of C, H and F is $CHF_3$.

6. An etching method according to claim 2, wherein; an inert gas is added into said processing gas.

7. An etching method according to claim 2, wherein; said photoresist layer is removed during an ashing step, and wherein said etching step, said ashing step, and said $H_2$ plasma process are implemented inside a single processing chamber.

8. An etching method according to claim 2, wherein; a step implemented after said etching step and before said $H_2$ plasma processing step, in which said photoresist layer is ashed.

9. A method for etching an $SiN_x$, layer on a Cu layer of a workpiece placed inside a processing chamber, the method comprising:

introducing a processing gas comprising C, H, and F, and $O_2$ into a processing chamber, the $O_2$ suppressing injection of C atoms and F atoms of the processing gas into an exposed portion of the Cu layer while the $SiN_x$ layer is etched; and raising the processing gas introduced into the processing chamber to plasma to etch the $SiN_x$ layer such that a portion of the Cu layer is exposed.

10. The method of claim 9, wherein processing gas is $CH_2F_2$.

11. The method of claim 9, wherein the processing gas is $CH_3F$.

12. The method of claim 9, wherein the processing gas is $CHF_3$.

13. The method of claim 9, further comprising introducing an inert gas into the processing chamber.

14. The method of claim 9, further comprising treating the exposed portion of the Cu layer with $H_2$ plasma by introducing $H_2$ into the processing chamber after etching and raising the $H_2$ to plasma and exposing the exposed portion of the Cu layer to the $H_2$ plasma removing C atoms and F atoms introduced into the exposed portion of the Cu layer during etching.

15. The method of claim 14, wherein etching the $SiN_x$ layer comprises providing a photoresist layer having a specific pattern on the $SiN_x$ layer; and the method further comprises ashing the photoresist layer after etching the $SiN_x$ layer and before treating the exposed portion of the Cu layer with $H_2$ plasma.

16. The method of claim 15, wherein the etching, the ashing, and the treating of the exposed portion of the Cu layer with $H_2$ plasma are implemented inside a single processing chamber.

17. The method of claim 15, further comprising setting the workpiece to a temperature less than or equal to 100° C. during the ashing step.

18. A method for etching an $SiN_x$ layer on a Cu layer of a workpiece placed inside a processing chamber, the method comprising:

introducing a processing gas comprising C, H, and F, and $O_2$ into a processing chamber, the $O_2$ suppressing oxidation of an exposed portion of the Cu layer while the $SiN_x$ layer is etched; and raising the processing gas introduced into the processing chamber to plasma to etch the $SiN_x$ layer such that a portion of the Cu layer is exposed.

19. The method of claim 18, wherein processing gas is $CH_2F_2$.

20. The method of claim 18, wherein the processing gas is $CH_3F$.

21. The method of claim 18, wherein the processing gas is $CHF_3$.

22. The method of claim 18, further comprising introducing an inert gas into the processing chamber.

23. The method of claim 18, further comprising treating the exposed portion of the Cu layer by introducing $H_2$ into the processing chamber after etching and raising the $H_2$ to plasma such that the exposed portion of the Cu layer is exposed to the $H_2$ plasma removing C atoms and F atoms introduced into the exposed portion of the Cu layer during etching.

24. The method of claim 23, wherein etching the $SiN_x$ layer comprises providing a photoresist layer having a specific pattern on the $SiN_x$ layer; and the method further comprises ashing the photoresist layer after etching the $SiN_x$ layer and before treating the exposed portion of the Cu layer with $H_2$ plasma.

25. The method of claim 24, wherein the etching, the ashing, and the treating of the exposed portion of the Cu layer with $H_2$ plasma are implemented inside a single processing chamber.

26. The method of claim 24, further comprising setting the workpiece to a temperature less than or equal to 100° C. during the ashing step.

27. A method for etching an $SiN_x$ layer on a Cu layer of a workpiece placed inside a processing chamber, the method comprising:

introducing a processing gas comprising C, H, and F, and $O_2$ into a processing chamber, the $O_2$ suppressing oxidation of an exposed portion of the Cu layer and suppressing injection of C atoms and F atoms of the processing gas into the exposed portion of the Cu layer while the $SiN_x$ layer is etched; and raising the processing gas introduced into the processing chamber to plasma to etch the $SiN_x$ layer such that a portion of the Cu layer is exposed.

28. The method of claim 27, wherein processing gas is $CH_2F_2$.

29. The method of claim 27, wherein the processing gas is $CH_3F$.

30. The method of claim 27, wherein the processing gas is $CHF_3$.

31. The method of claim 27, further comprising introducing an inert gas into the processing chamber.

32. The method of claim 27, further comprising treating the exposed portion of the Cu layer by introducing $H_2$ into the processing chamber after etching and raising the $H_2$ to plasma such that the exposed portion of the Cu layer is exposed to the $H_2$ plasma removing C atoms and F atoms introduced into the exposed portion of the Cu layer during etching.

33. The method of claim 32, wherein etching the $SiN_x$ layer comprises providing a photoresist layer having a specific pattern on the $SiN_x$ layer; and the method further comprises ashing the photoresist layer after etching the $SiN_x$ layer and before treating the exposed portion of the Cu layer with $H_2$ plasma.

34. The method of claim 33, wherein the etching, the ashing, and the treating of the exposed portion of the Cu layer with $H_2$ plasma are implemented inside a single processing chamber.

35. The method of claim 33, further comprising setting the workpiece to a temperature less than or equal to 100° C. during the ashing step.

* * * * *

UNITED STATES PATENT AND TRADEMARK OFFICE
CERTIFICATE OF CORRECTION

PATENT NO. : 6,780,342 B1
DATED : August 24, 2004
INVENTOR(S) : Hagihara et al.

It is certified that error appears in the above-identified patent and that said Letters Patent is hereby corrected as shown below:

Column 7,
Line 15, after "layer", insert a comma.
Line 41, after "$SiN_x$", delete the comma.

Column 10,
Line 5, "etching,the" should read -- etching, the --.

Signed and Sealed this

Thirtieth Day of November, 2004

JON W. DUDAS
*Director of the United States Patent and Trademark Office*